United States Patent
Huang et al.

[11] Patent Number: 5,956,598
[45] Date of Patent: Sep. 21, 1999

[54] METHOD FOR FABRICATING A SHALLOW-TRENCH ISOLATION STRUCTURE WITH A ROUNDED CORNER IN INTEGRATED CIRCUIT

[75] Inventors: Kuo-Tai Huang; Gwo-Shii Yang, both of Hsinchu; Tri-Rung Yew, Hsinchu Hsien; Water Lur, Taipei, all of Taiwan

[73] Assignee: United Microelectronics Corp., Hsinchu, Taiwan

[21] Appl. No.: 09/164,736

[22] Filed: Oct. 1, 1998

[30] Foreign Application Priority Data

Jul. 2, 1998 [TW] Taiwan ................................ 87110706

[51] Int. Cl.$^6$ .................................................. H01L 21/76
[52] U.S. Cl. ........................... 438/424; 438/221; 438/297
[58] Field of Search ..................... 438/221, 297, 438/424, 697

[56] References Cited

U.S. PATENT DOCUMENTS

| | | | |
|---|---|---|---|
| 5,258,332 | 11/1993 | Horioka et al. | 438/221 |
| 5,578,518 | 11/1996 | Koike et al. | 438/424 |
| 5,712,185 | 1/1998 | Tsai et al. | 434/424 |
| 5,837,612 | 11/1998 | Ajuria et al. | 438/697 |

FOREIGN PATENT DOCUMENTS 09181163  7/1997  Japan .

*Primary Examiner*—Charles Bowers
*Assistant Examiner*—David S Blum
*Attorney, Agent, or Firm*—Jiawei Huang; J. C. Patents

[57] ABSTRACT

A semiconductor fabrication method is provided for fabricating a shallow-trench isolation (STI) structure with a rounded corner in integrated circuits through a rapid thermal process (RTP). In the fabrication of the STI structure, a sharp corner is often undesirably formed. This sharp corner, if not eliminated, causes the occurrence of a leakage current when the resultant IC device is in operation that significantly degrades the performance of the resultant IC device. To eliminate this sharp corner, an RTP is performed at a temperature of above 1,100° C., which temperature is higher than the glass transition temperature of the substrate, for about 1 to 2 minutes. The result is that the surface of the substrate is oxidized into an sacrificial oxide layer and the sharp corner is deformed into a rounded shape with a larger convex radius of curvature. This allows the problems arising from the existence of the sharp corner to be substantially eliminated. Compared to the prior art, this method not only is more simplified in process, but also allows a considerable saving in thermal budget, which makes this method more cost-effective to implement than the prior art.

10 Claims, 4 Drawing Sheets

METHOD FOR FABRICATING A SHALLOW-TRENCH ISOLATION STRUCTURE WITH A ROUNDED CORNER IN INTEGRATED CIRCUIT

CROSS-REFERENCE TO RELATED APPLICATION

This application claims the priority benefit of Taiwan application Ser. No. 87110706, filed Jul. 2, 1998, the full disclosure of which is incorporated herein by reference.

BACKGROUND OF THE INVENTION

1. Field of the Invention

This invention relates to a semiconductor fabrication method, and more particularly, to a method of fabricating a shallow-trench isolation (STI) structure with a rounded corner in an integrated circuit (IC) through a rapid thermal process (RTP).

2. Description of Related Art

The STI technique is a widely used semiconductor fabrication method for forming isolation structures in integrated circuits to electrically isolate the various active components formed in the integrated circuit. In the STI technique, the first step is to form a plurality of trenches at predefined locations in the substrate and then deposit an oxide into each of these trenches to form an STI structure. One major advantage of using the STI technique is that it allows high scalability to CMOS (complementary metal-oxide semiconductor) IC devices for fabrication at the submicron level of integration. In addition, it can help prevent the occurrence of the so-called bird's beak encroachment in the integrated circuit that would otherwise occur when using the conventional LOCOS (Local Oxidation of Silicon) technique to form the isolation structures.

FIGS. 1A–1D are schematic sectional diagrams used to depict the process steps involved in a conventional method for fabricating an STI structure in integrated circuits.

Referring to FIG. 1A, in the first step, a semiconductor substrate 100 is prepared. Then, after the substrate 100 is placed in a chamber filled with oxygen, a thermal oxidation process is performed on the substrate 100 so as to form a pad oxide layer 102 over the substrate 100. A mask layer 104 is then formed from silicon nitride (SiN) over the pad oxide layer 102 through a chemical-vapor deposition (CVD) process. After this, a photoresist layer (not shown) is coated over the wafer and then selectively removed in such a manner as to expose a predefined part of the wafer. Then, with the photoresist layer (not shown) serving as mask, an anisotropic etching process is performed on the wafer to etch away the unmasked portions of the mask layer 104, the pad oxide layer 102, and the substrate 100 until a predetermined depth in the substrate 100 is reached. Through this process, a trench 106 is formed in the substrate 100. After this, prior to forming liner oxide in trench 106, a pre-liner cleaning process is first performed on the exposed surfaces of substrate 100 in trench 106 with RCA-A and a 10:1 solution of deionized water and hydrofluoric acid (HF) for a continuous period of about 60 seconds. During this process, however, a small edge part of the pad oxide layer 102 near the top rim of trench 106 in substrate 100 is undesirably etched away, resulting in the formation of a sharp corner 107 at the rim of trench 106.

Referring next to FIG. 1B, in the subsequent step, a liner oxide layer 108 is formed through a thermal oxidation process under a temperature of between 850° C. to 950° C. on the exposed surfaces of substrate 100 in trench 106. Since the process temperature used to form the liner oxide layer 108 is in the range of 850° C. to 950° C., which is relatively low, it does not cause the sharp corner 107 to be deformed into a rounded one. Since the sharp corner 107 has a very small convex curvature radius, a very high electric field can form there when an electric current is flowing through the resultant IC device. This electric filed causes undesired current leakage which in turn causes the resultant IC device to have highly deviant IV (current-to-voltage) characteristics. As a result, the resultant IC device suffers from a kink effect that considerably degrades the performance.

Referring to FIG. 1C, in the subsequent step, an insulating material, such as silicon dioxide, is deposited through a CVD process into trench 106 to a predetermined height above the pad oxide layer 102 so as to form an oxide layer 110 in trench 106 to form an STI structure 106a. Next, a densification process is performed under a temperature of about 1,000° C. to densify the oxide layer 110 in the STI structure 106a. After this, the entire mask layer 104 is removed.

Referring next to FIG. 1D, in the subsequent step, a wet-etching process is performed on the wafer to remove the entire pad oxide layer 102 over the substrate 100. Since this wet-etching process is isotropic, it also causes a lateral part of the oxide layer 110 above the topmost surface of the substrate 100 to be etched away. This causes the topmost surface of the liner oxide layer 108 to be etched away. As a result, a groove 112 is formed in the top surface of the liner oxide layer 108, causing the sharp corner 107 to be exposed.

FIG. 2 shows an enlarged view of the groove 112 and the sharp corner 107 in the fabricated wafer of FIG. 1D. As shown, since the sharp corner 107 has a very small convex radius of curvature, a high electrical field can occur at the sharp corner 107 when the resultant IC device is in operation, thus causing a leakage current to be produced at the sharp corner 107. This leakage current then causes the resultant IC device to have highly deviant IV characteristics. More specifically, under the same voltage supply, the induced current is be reduced in magnitude due to the existence of the above-mentioned leakage current. As a result, the resultant IC device suffers from a kink effect in subthreshold voltage that considerably degrades the performance of the resultant IC device.

There exists, therefore, a need in the semiconductor industry for a method to fabricate an STI structure with a rounded corner. One such solution is disclosed in the technical paper, A Highly Manufacturable Comer Rounding Solution for 0.18 μm Shallow Trench Isolation" proposed by C. P. Chang and C. S. Pai, et al. By this corner rounding solution, such techniques as Trench Etch, High Temperature Liner (above 1,100° C.), and Post CMP Re-Oxidation are used to form an STI structure with a rounded corner in integrated circuit. These techniques, however, are either too difficult to carry out or too costly in thermal budget to implement.

SUMMARY OF THE INVENTION

It is therefore an objective of the present invention to provide a method for fabricating an STI structure with a rounded corner in integrated circuits, which is easier to carry out than the method of the prior art.

It is another objective of the present invention to provide a method for fabricating an STI structure with a rounded corner in integrated circuits, which can be performed with a lower thermal budget than the prior art so as to save IC manufacturing cost.

In accordance with the foregoing and other objectives of the present invention, an improved method for fabricating an STI structure with a rounded corner in integrated circuits is provided.

By the method of the invention, the first step is to prepare a semiconductor substrate. Next, a pad oxide layer is formed over the substrate, and then a mask layer is formed over the pad oxide layer. Subsequently, a trench is formed in the substrate by etching away selected portions of the mask layer, the pad oxide layer, and the substrate; and then a pre-liner cleaning process is performed on the exposed surfaces of the substrate in the trench. During this cleaning process, however, a small edge part of the pad oxide layer near the top rim of the trench is also etched away, resulting in the formation of an undesired sharp corner at the top rim of the trench. After this, a liner oxide layer is formed on the exposed surfaces of the substrate in the trench through a thermal oxidation process at a temperature of about 850–950° C. Next, an oxide layer is deposited in the trench to form the desired STI structure. After this, the mask layer and the pad oxide layer are successively removed. During the etching process to remove the pad oxide layer, however, an upper part of the liner oxide layer is etched away to form a groove adjacent to the sharp corner. It is a characteristic feature of the invention that, in the subsequent step, an RTP (rapid thermal process) is performed at a temperature of above 1,100° C., which temperature is higher than the glass transition temperature of the substrate, for 1 to 2 minutes so as to form a sacrificial oxide layer over the exposed surfaces of the substrate and deform the sharp corner into a rounded shape.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

FIGS. 3A–3D are schematic sectional diagrams used to depict the process steps involved in the method of the invention for fabricating an STI structure with a rounded corner in an integrated circuit.

Figure 1A:
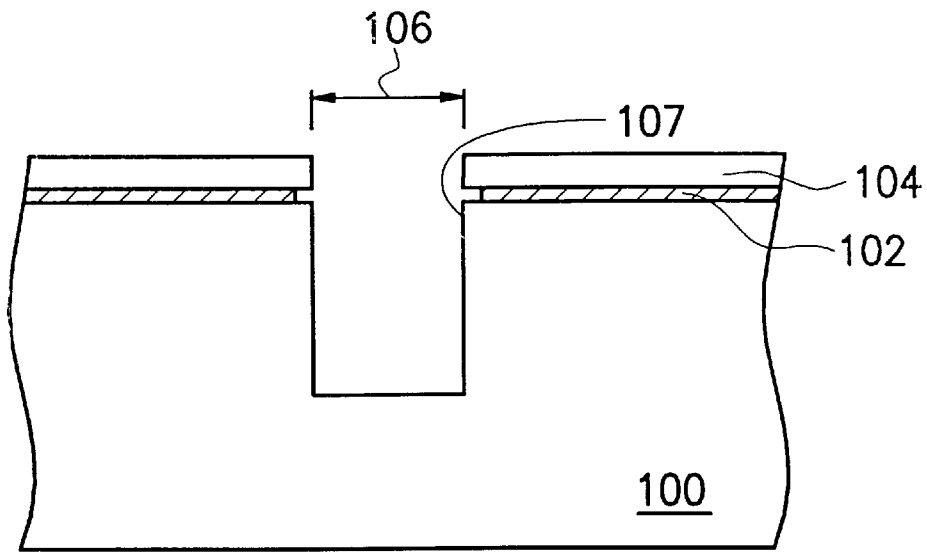
FIGS. 1A–1D are schematic sectional diagrams used to depict the process steps involved in a conventional method for fabricating an STI structure an in integrated circuit.
Figure 1B:
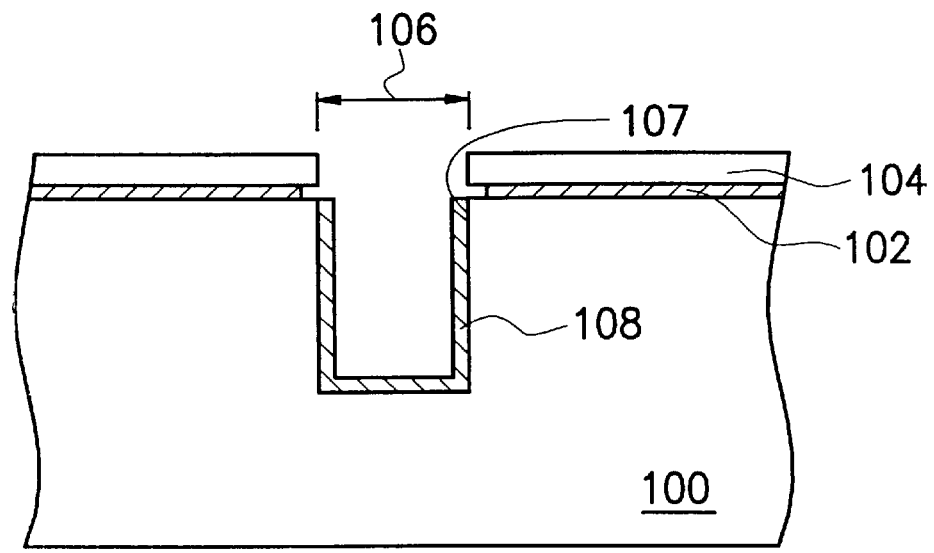
Figure 1C:
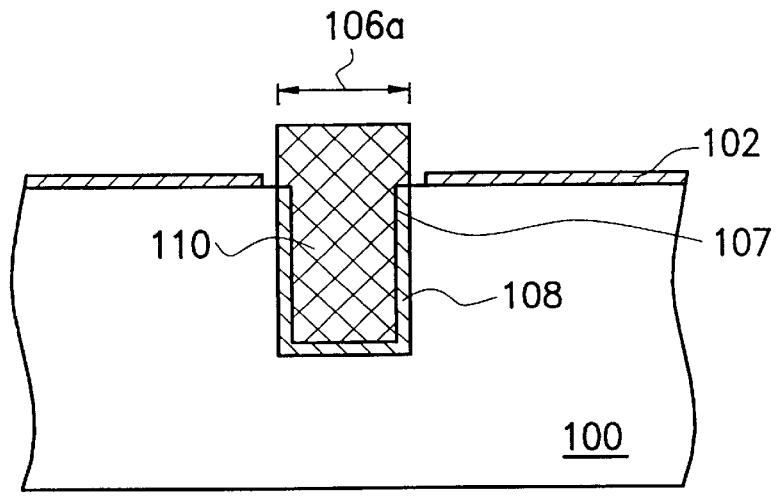
Figure 1D:
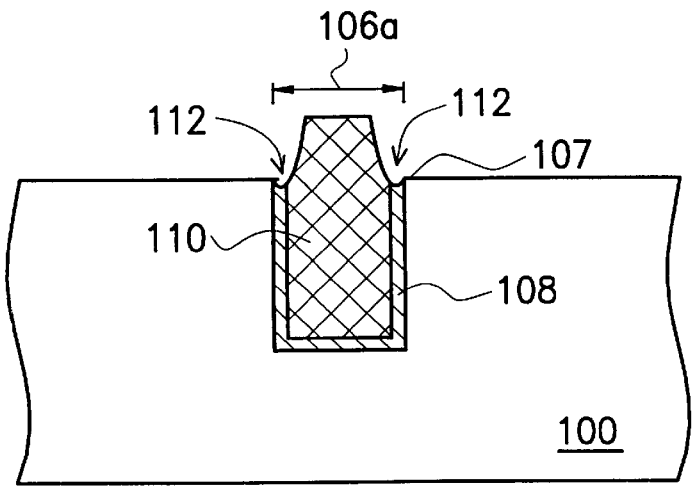
Figure 2:
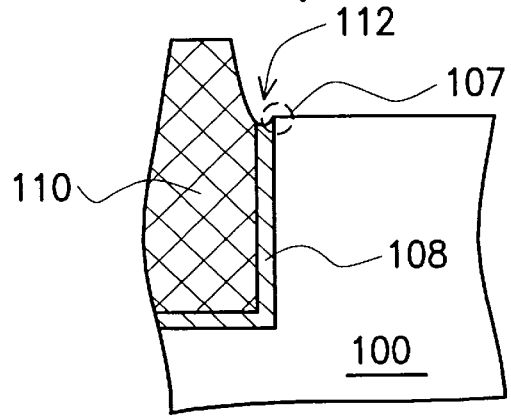
FIG. 2 shows an enlarged view of part of the fabricated wafer of FIG. 1D where an undesired sharp corner is formed.
Figure 3A:
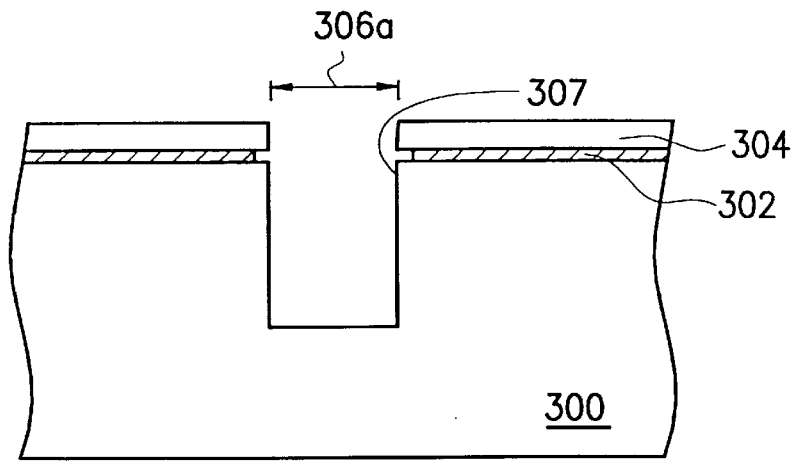
FIGS. 3A–3E are schematic sectional diagrams used to depict the process steps involved in the method of the invention for fabricating an STI structure with a rounded corner in an integrated circuit.

Referring first to FIG. 3A, in the first step, a semiconductor substrate 300 is prepared. Then, a pad oxide layer 302 is formed over the substrate 300. Next, a mask layer 304 is formed from silicon nitride (SiN) over the pad oxide layer 302 through a CVD process. After this, a photoresist layer (not shown) is coated over the wafer and is then selectively removed in such a manner as to expose a predefined part of the wafer. Subsequently, with the photoresist layer (not shown) serving as a mask, an anisotropic dry-etching process is performed on the wafer to etch away the unmasked portions of the mask layer 304, the pad oxide layer 302, and the substrate 300 until a predetermined depth is reached in the substrate 300. Through this process, a trench 306 is formed in the substrate 300. After this, prior to the formation of liner oxide in trench 306, a pre-liner cleaning process is first performed on the exposed surfaces of substrate 300 in trench 306 with RCA-A and a 10:1 solution of deionized water and hydrofluoric acid (HF) for a continuous period of about 60 seconds. During this process, however, a small edge part of the pad oxide layer 302 near the top rim of the trench 306 is be also etched away, resulting in the forming of an undesired sharp corner 307 at the top rim of the trench 306.

Figure 3B:
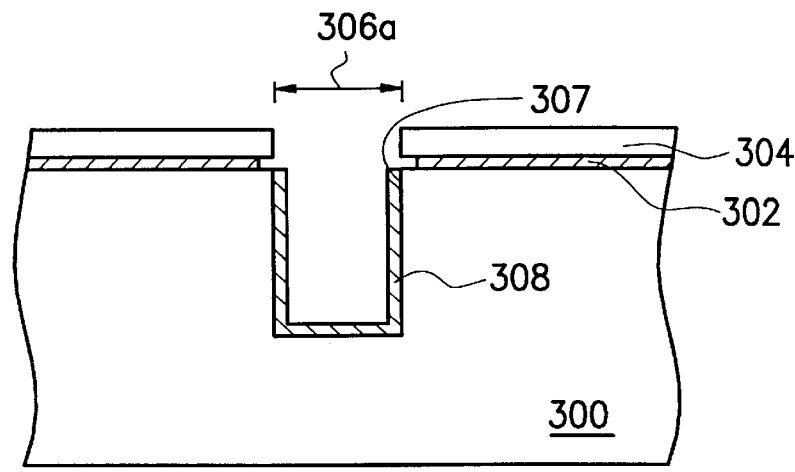

Referring next to FIG. 3B, in the subsequent step, a liner oxide layer 308 is formed through a thermal oxidation process under a temperature of about 850–950° C. on the exposed surfaces of the substrate 300 in the trench 306. Since the process temperature used to form the liner oxide layer 308 is in the range from 850° C. to 950° C., which is relatively low compared to the glass transition temperature of the substrate 300, it does not cause the shape of the sharp corner 307 to be deformed. As mentioned in the background section of this specification, the existence of the sharp corner 307, due to its small convex curvature radius, causes the occurrence of a high electric field at the sharp corner 307. This electric field causes undesired current leakage, which in turn causes the resultant IC device to have highly deviant IV (current to voltage) characteristics. Therefore, if this sharp corner 307 is not rounded, it causes the resultant IC device to suffer from a kink effect that considerably degrades the performance of the resultant IC device. The step of rounding the sharp corner 307 in accordance with the invention is performed later.

Figure 3C:
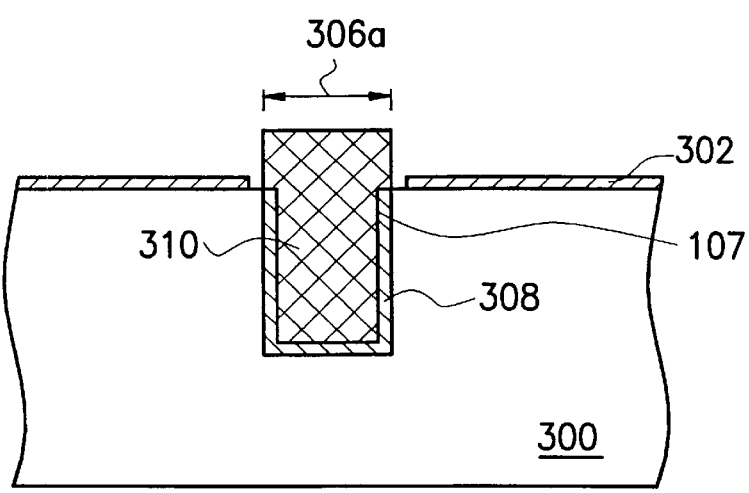

Referring next to FIG. 3C, in the subsequent step, an insulating material, such as silicon dioxide, is deposited through a CVD process into the trench 306 to a predetermined height above the topmost surface of the pad oxide layer 302 so as to form an oxide layer 310 in the trench 306 to form an STI structure 306a. Next, a densification process is performed under a temperature of about 1,000° C. to densify the oxide layer 310 in the STI structure 306a. After this, the entire mask layer 304 is removed.

Figure 3D:
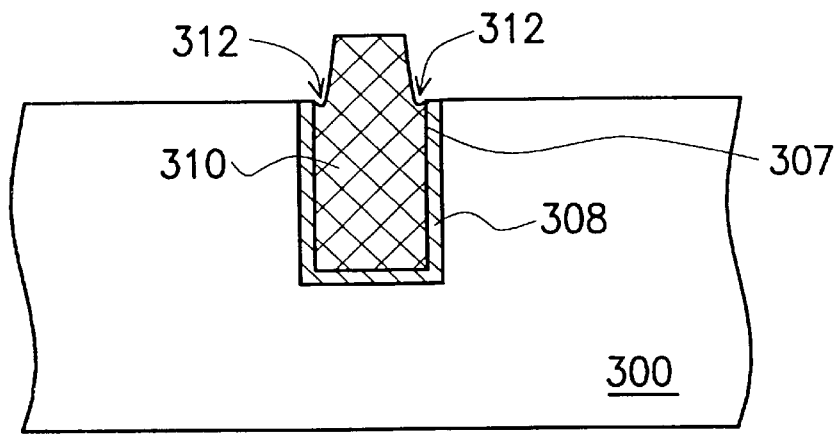

Referring further to FIG. 3D, in the subsequent step, a wet-etching process is performed on the wafer to remove the entire pad oxide layer 302 over the substrate 300. Since this wet-etching process is isotropic, it also etches away a lateral part of the oxide layer 310 above the substrate 300, thus further causing the topmost surface of the liner oxide layer 308 to be etched away. As a result, a groove 312 is formed in the top surface of the liner oxide layer 308, causing the sharp corner 307 to be exposed.

Figure 3E:
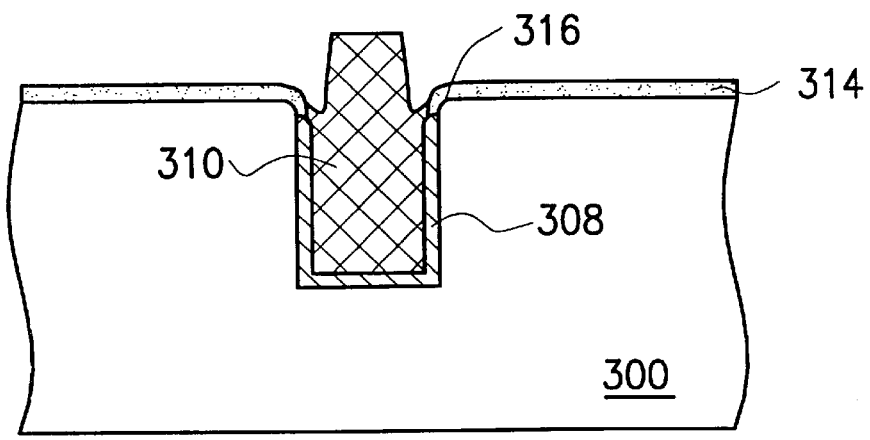

Referring further to FIG. 3E, in the subsequent step, after the wafer is placed in a chamber filled with a mixture of oxygen and nitrous oxide (N$_2$O), a rapid thermal process (RTP) is performed on the wafer at a temperature of above 1,100° C. for a continuous period of about 1 to 2 minutes, whereby the surface of the substrate 300 is oxidized to form an oxide layer 314 (which is referred to as a sacrificial oxide layer in this specification) to a controlled thickness of about 70–200 Å (angstrom). Through this RTP, since the process temperature is higher than the glass transition temperature of the substrate 300, the sharp corner 307 melts and thus deformed into a rounded corner 316.

Figure 4:
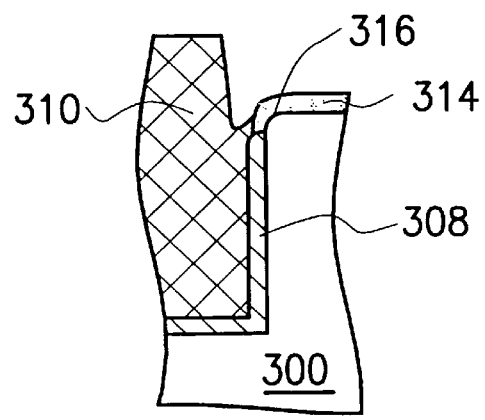
FIG. 4 shows an enlarged view of part of the fabricated wafer of FIG. 3E where the undesired sharp corner is substantially rounded.

FIG. 4 shows an enlarged view of part of the fabricated wafer of FIG. 3E where the rounded corner 316 is formed.

As shown, the undesired sharp corner 307 (FIG. 3D) is now deformed into a substantially rounded shape with a larger convex radius of curvature than the sharp corner 307. As a result, the problem of a high electric field resulting from the sharp corner, as seen in the prior art, can be lessened here. The resultant IC device can thus retain its IV characteristics for more reliable performance.

In conclusion, the method of the invention has the following advantages over the prior art.

(1) First, the method of the invention allows the resultant STI structure to be formed with a rounded corner through a more simplified process than the prior art. This is achieved simply by performing an RTP on the wafer at a temperature above 1,100° C. which exceeds the glass transition temperature of the substrate.

(2) Second, the method of the invention can allow a considerable saving in thermal budget when compared to the prior art. This is because the RTP used in the method of the invention is performed at a temperature of above 1,100° C. for only 1 to 2 minutes, whilst the thermal oxidation process used in the prior art is performed at 1,000° C. for 10 to 30 minutes to achieve the same result.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating an STI structure with a rounded corner in an integrated circuit, comprising the steps of:

preparing a semiconductor substrate;

forming a pad oxide layer over the substrate;

forming a mask layer over the pad oxide layer;

forming a trench in the substrate by etching away selected portions of the mask layer, the pad oxide layer, and the substrate;

performing a pre-liner cleaning process on the exposed surfaces of the substrate in the trench, during which a small edge part of the pad oxide layer near the top rim of the trench is also etched away, resulting in the formation of an undesired sharp corner at the top rim of the trench;

forming a liner oxide layer on the exposed surfaces of the substrate in the trench;

forming an oxide layer in the entire trench to form the desired STI structure;

removing the mask layer;

removing the pad oxide layer, through which a groove is formed in the top surface of the liner oxide layer adjacent to the sharp corner; and performing an RTP at a temperature of above 1,100° C. for a period of from 1 to 2 minutes so as to form a sacrificial oxide layer over the exposed surfaces of the substrate and deform the sharp corner into a rounded shape.

2. The method of claim 1, wherein the mask layer is formed from silicon nitride.

3. The method of claim 1, wherein the step of forming the trench includes the sub-steps of:

forming a photoresist layer over the mask layer;

removing a selected part of the photoresist layer at a predefined location where the trench is to be formed; and performing an anisotropic dry-etching process to etch away the unmasked portions of the mask layer, the pad oxide layer, and the substrate until a predetermined depth in the substrate is reached, with the resulting void portion serving as the trench.

4. The method of claim 1, wherein the pre-liner cleaning process is performed with RCA-A and a 10:1 solution of deionized water and hydrofluoric acid (HF) for a continuous period of 60 seconds.

5. The method of claim 1, wherein the liner oxide layer is formed by subjecting the substrate to a thermal oxidation process under a temperature of about 850–950° C.

6. The method of claim 1, wherein the oxide layer in the STI structure is formed through a CVD process.

7. The method of claim 1, wherein the oxide layer in the STI structure is formed from silicon dioxide.

8. The method of claim 1, wherein the step of removing the pad oxide layer is carried out through a wet-etching process.

9. The method of claim 1, wherein the sacrificial oxide layer is formed to a thickness of between 70–200 Å.

10. The method of claim 1, wherein the RTP is performed by exposing the substrate to a gaseous mixture of oxygen and nitrous oxide.

* * * * *